US011393736B2

(12) United States Patent
Harrison et al.

(10) Patent No.: US 11,393,736 B2
(45) Date of Patent: Jul. 19, 2022

(54) METHOD OF MANUFACTURING A SEMICONDUCTOR DEVICE HAVING AN INTEGRATED PN DIODE TEMPERATURE SENSOR

(71) Applicant: Infineon Technologies Austria AG, Villach (AT)

(72) Inventors: Mark Harrison, Wernberg (AT); Georg Schinner, Munich (DE)

(73) Assignee: Infineon Technologies Austria AG, Villach (AT)

( * ) Notice: Subject to any disclaimer, the term of this patent is extended or adjusted under 35 U.S.C. 154(b) by 17 days.

(21) Appl. No.: 16/557,057

(22) Filed: Aug. 30, 2019

(65) Prior Publication Data
US 2020/0006185 A1   Jan. 2, 2020

Related U.S. Application Data

(62) Division of application No. 15/831,686, filed on Dec. 5, 2017, now abandoned.

(51) Int. Cl.
*H01L 23/34* (2006.01)
*H01L 27/06* (2006.01)
(Continued)

(52) U.S. Cl.
CPC ............ *H01L 23/34* (2013.01); *G01K 7/01* (2013.01); *H01L 21/02532* (2013.01); *H01L 21/02592* (2013.01); *H01L 21/02595* (2013.01); *H01L 21/26513* (2013.01); *H01L 21/30604* (2013.01); *H01L 21/76877* (2013.01); *H01L 21/8234* (2013.01); *H01L 21/823475* (2013.01); *H01L 27/0629* (2013.01); *H01L 29/04* (2013.01);
(Continued)

(58) Field of Classification Search
CPC ............ H01L 27/0255; H01L 29/7808; H01L 27/7808; H01L 27/7813; H01L 29/7813; H01L 29/0255
See application file for complete search history.

(56) References Cited

U.S. PATENT DOCUMENTS

2002/0106587 A1\* 8/2002 Lukanc ............... G03F 7/70466
430/312
2007/0176239 A1\* 8/2007 Hshieh ................ H01L 29/7811
257/355

(Continued)

*Primary Examiner* — Samuel A Gebremariam
*Assistant Examiner* — Jonas T Beardsley
(74) *Attorney, Agent, or Firm* — Murphy, Bilak & Homiller, PLLC

(57) ABSTRACT

A method of manufacturing a semiconductor device includes: forming one or more transistor cells in a first region of a semiconductor substrate, the semiconductor substrate having a second region that is devoid of transistor cells; forming a first dielectric material over the first and second regions; forming a second dielectric material over the first dielectric material; forming a pn diode in the first dielectric material over the second region; etching first contact grooves into a p-type region of the pn diode, second contact grooves into an n-type region of the pn diode, and third contact grooves into the first region of the semiconductor substrate at the same time using a common contact formation process; and filling the first contact grooves, the second contact grooves and the third contact grooves with an electrically conductive material.

17 Claims, 19 Drawing Sheets

(51) Int. Cl.
*H01L 29/861* (2006.01)
*H01L 29/417* (2006.01)
*H01L 29/16* (2006.01)
*H01L 21/8234* (2006.01)
*H01L 29/04* (2006.01)
*H01L 21/306* (2006.01)
*H01L 21/768* (2006.01)
*H01L 21/265* (2006.01)
*H01L 21/02* (2006.01)
*H01L 29/66* (2006.01)
*G01K 7/01* (2006.01)

(52) U.S. Cl.
CPC ............ *H01L 29/16* (2013.01); *H01L 29/417* (2013.01); *H01L 29/66136* (2013.01); *H01L 29/861* (2013.01)

(56) References Cited

U.S. PATENT DOCUMENTS

| | | | |
|---|---|---|---|
| 2010/0289073 A1* | 11/2010 | Hsieh | H01L 29/66734 257/328 |
| 2013/0075810 A1* | 3/2013 | Hsieh | H01L 29/7811 257/328 |
| 2014/0070319 A1* | 3/2014 | Tonomura | H01L 27/0255 257/355 |
| 2014/0183627 A1* | 7/2014 | Ma | H01L 29/66727 257/334 |
| 2014/0353665 A1 | 12/2014 | Fujii | |
| 2016/0307884 A1* | 10/2016 | Weyers | H01L 29/7396 |

* cited by examiner

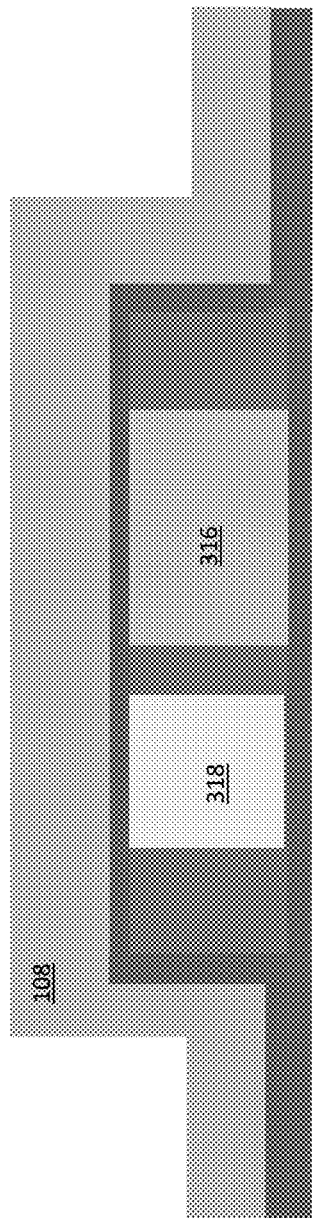

METHOD OF MANUFACTURING A SEMICONDUCTOR DEVICE HAVING AN INTEGRATED PN DIODE TEMPERATURE SENSOR

BACKGROUND

Micro-pattern trench (MPT) cell design technology provides sub-micron mesas and is used to implement insulated gate bipolar transistors (IGBTs) and other types of power transistors to achieve high-voltage (e.g. 1200 V) devices with reduced overall power losses. Temperature sensors are often integrated in power transistor dies (chips) to provide accurate temperate information. An integrated temperature sensor for MPT power transistor technology is needed.

SUMMARY

According to an embodiment of a semiconductor device, the semiconductor device comprises: a semiconductor substrate having a first region with one or more transistor cells and a second region devoid of transistor cells; a first dielectric material over the first region and the second region of the semiconductor substrate; a second dielectric material over the first dielectric material; a pn diode formed in the first dielectric material over the second region of the semiconductor substrate; a plurality of first contacts extending from above the pn diode and into a p-type region of the pn diode so that the p-type region abuts sidewalls of each first contact; and a plurality of second contacts extending from above the pn diode and into an n-type region of the pn diode so that the n-type region abuts sidewalls of each second contact.

According to an embodiment of a method of manufacturing a semiconductor device, the method comprises: forming one or more transistor cells in a first region of a semiconductor substrate, the semiconductor substrate having a second region that is devoid of transistor cells; forming a first dielectric material over the first region and the second region of the semiconductor substrate; forming a second dielectric material over the first dielectric material; forming a pn diode in the first dielectric material over the second region of the semiconductor substrate; forming a plurality of first contacts that extend from above the pn diode and into a p-type region of the pn diode so that the p-type region abuts sidewalls of each first contact; and forming a plurality of second contacts that extend from above the pn diode and into an n-type region of the pn diode so that the n-type region abuts sidewalls of each second contact.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3A through 3H illustrate another embodiment of manufacturing the integrated pn diode temperature sensor.

DETAILED DESCRIPTION

Embodiments described herein provide a semiconductor device with an integrated pn diode temperature sensor, and corresponding methods of manufacture. The pn diode temperature sensor, which can be implemented as a polycrystalline or amorphous silicon pn diode, is formed inside a standard dielectric material provided as part of the device. In the case of MPT technology, the resulting IGBT or power MOSFET gains temperature sensing capability without any changes to the base technology or performance.

Figure 1A:
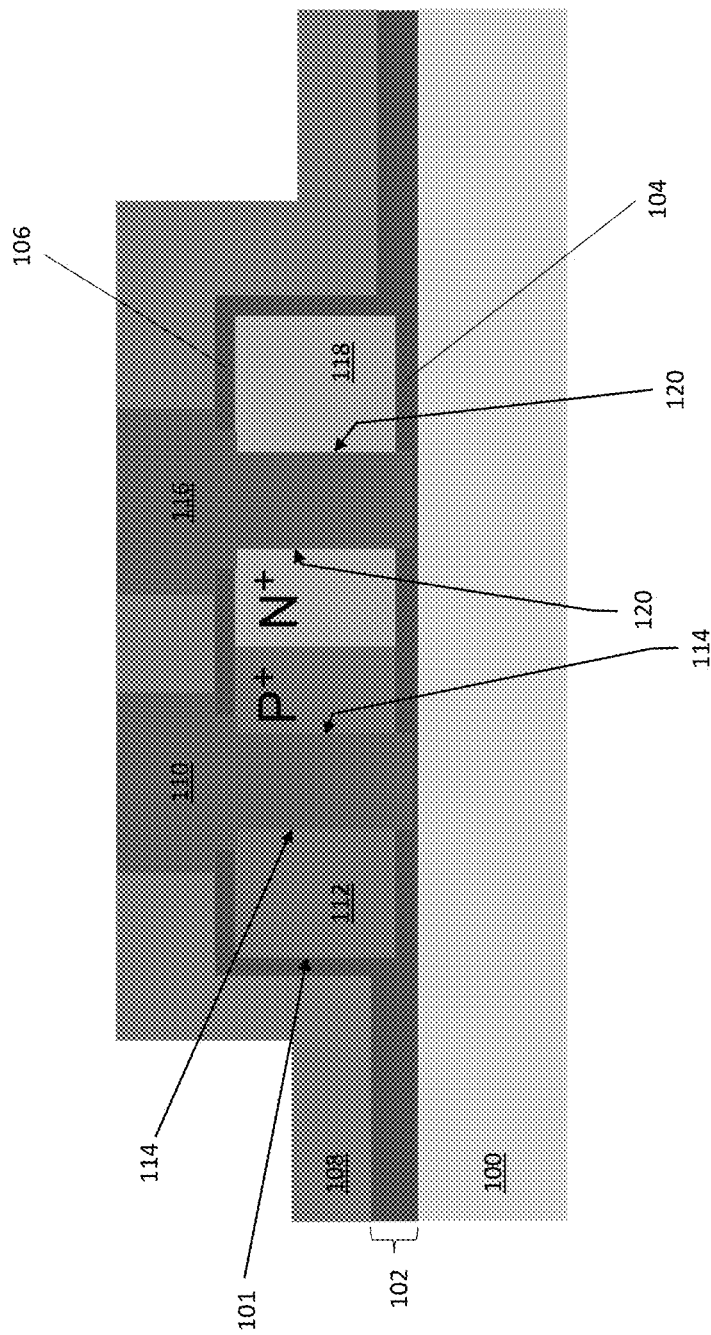
FIG. 1A illustrates a partial sectional view of an embodiment of an integrated pn diode temperature sensor.

FIG. 1A illustrates a sectional view of an embodiment of an integrated pn diode temperature sensor, formed over a region of a semiconductor substrate devoid of transistor cells. An isolation dielectric 100 such as LOCOS (LOCal Oxidation of Silicon) covers the region of the substrate devoid of transistor cells, to provide isolation for an adjacent region which contains one or more transistor cells such as IGBT or power MOSFET cells. The semiconductor substrate is not shown in FIG. 1A for ease of illustration.

Figure 2A:
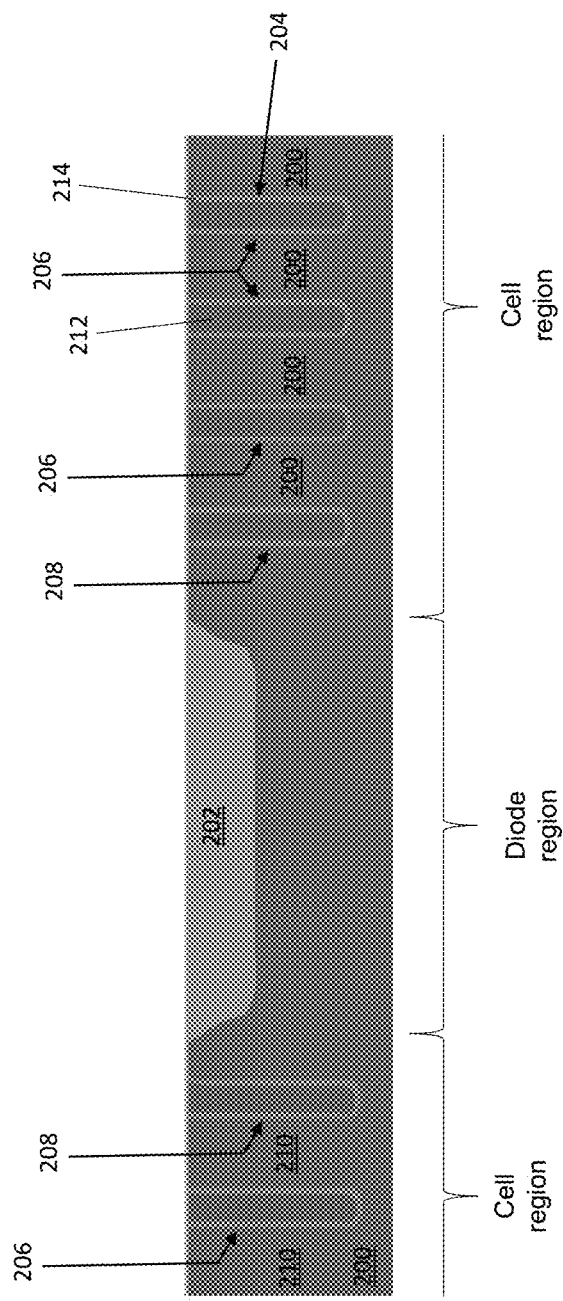
FIGS. 2A through 2E illustrate an embodiment of manufacturing the semiconductor device that includes the integrated pn diode temperature sensor.
Figure 2B:
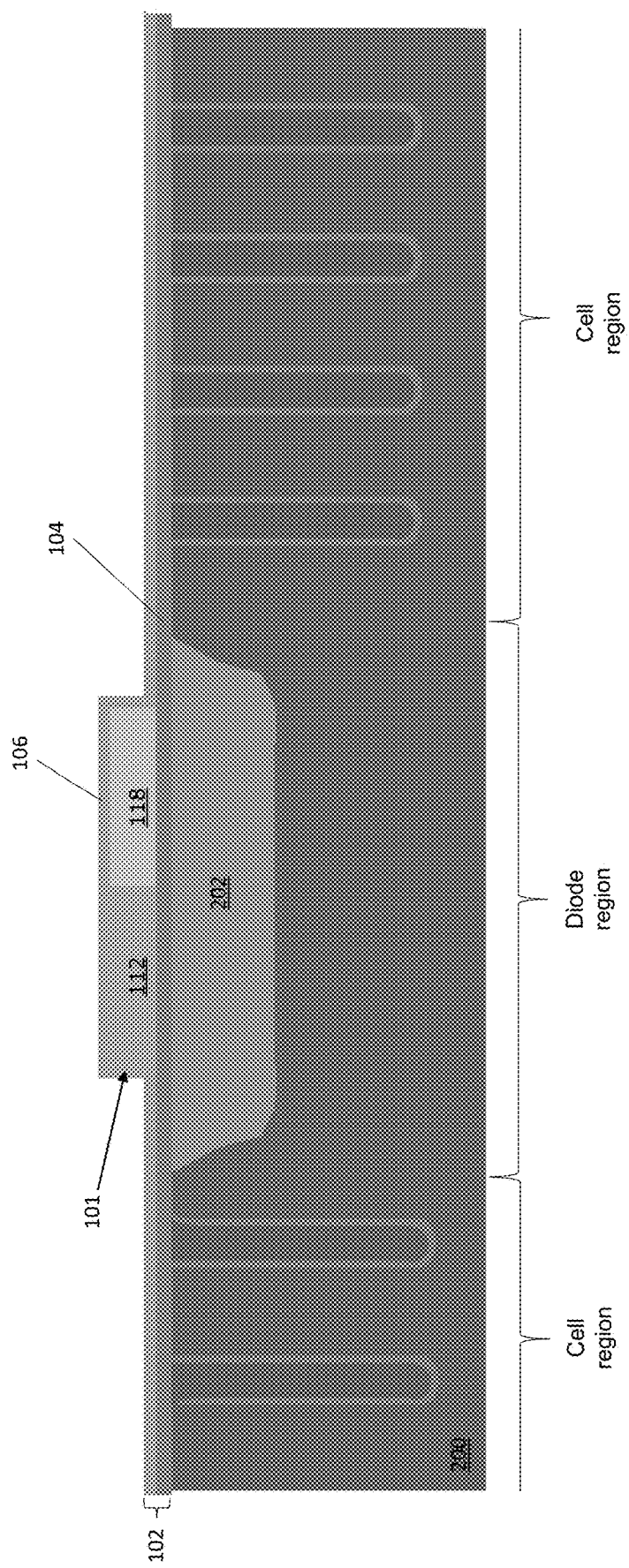

FIG. 2B illustrates a partial top-down plan view of the integrated pn diode temperature sensor shown in FIG. 1A.

The pn diode 101 is formed in a first interlayer dielectric material 102 over the region of the semiconductor substrate devoid of transistor cells. The first interlayer dielectric material 102 includes a lower layer 104 and an upper layer 106 over the lower layer 104. The upper layer 106 directly contacts the lower layer 104 over the region of the semiconductor substrate which contains one or more transistor cells. Over the region of the semiconductor substrate devoid of transistor cells, the pn diode 101 is formed between the lower layer 104 and the upper layer 106 of the first interlayer dielectric material 102. In one embodiment, the lower layer 104 of the first interlayer dielectric material 102 is thicker than the upper layer 106. For example, in the case of USG (undoped silicate glass) as the first interlayer dielectric material 102, the lower layer 104 can have a thickness of about 50 to 60 nm and the upper layer 106 can have a thickness of about 90 to 100 nm. Other layer thicknesses are possible, and the upper layer 106 instead can be thicker than the lower layer 104.

A second interlayer dielectric material 108 is formed over the first interlayer dielectric material 102, over both the region of the semiconductor substrate which contains one or more transistor cells and the region of the semiconductor substrate devoid of transistor cells. In one embodiment, the first interlayer dielectric material 102 comprises USG, the second interlayer dielectric material 108 comprises borophosphosilicate glass (BPSG), and the pn diode 101 comprises polycrystalline or amorphous silicon. In the case of polycrystalline or amorphous silicon, the pn diode 101 can have a thickness between 200 nm and 950 nm. Other pn diode thicknesses are possible.

A plurality of first contacts 110 extend from above the pn diode 101 and into a p-type region 112 of the pn diode 101 so that the p-type region 112 abuts sidewalls 114 of each first contact 110. A plurality of second contacts 116 extend from above the pn diode 101 and into an n-type region 118 of the pn diode 101 so that the n-type region 118 abuts sidewalls 120 of each second contact 116. In one embodiment, the plurality of first contacts 110 extends through the p-type region 112 of the pn diode 101 and into the lower layer 104 of the first interlayer dielectric material 102 disposed between the pn diode 101 and the underlying semiconductor substrate. Likewise, the plurality of second contacts 116 extends through the n-type region 118 of the pn diode 101 and into the lower layer 104 of the first interlayer dielectric material 102. The first interlayer dielectric material 102 and the second interlayer dielectric material 108 can be etched back around the perimeter of each first contact 110 and each second contact 116 as shown in FIG. 1A, so that the pn diode 101 is not covered by the first interlayer dielectric material 102 or the second interlayer dielectric material 108 in each region wherein the first interlayer dielectric material 102 and the second interlayer dielectric material 108 are etched back. FIG. 1A shows the second interlayer dielectric material 108 with more etch back than the first interlayer dielectric material 102, which can be due to a difference in dielectric material types and associated etch rates (e.g. BPSG for the second interlayer dielectric material 108 and USG for the first interlayer dielectric material 102).

The plurality of first contacts 110 can be formed in rows 122 of first contacts 110 that extend generally parallel with one another. Likewise, the plurality of second contacts 116 can be formed in rows 124 of second contacts 116 that extend generally parallel with one another. The first contacts 110 can be arranged in a first checkerboard pattern 126 and the second contacts 116 can be arranged in a second checkerboard pattern 128, as shown in FIG. 1B.

In some embodiments, and as described in more detail later herein, the first contacts 110 and the second contacts 116 are formed as part of a common contact formation process. During the common contact formation process, a plurality of third contacts (not shown in FIGS. 1A and 1B) which extend into the region of the semiconductor substrate with the one or more transistor cells are formed at the same time as the first contacts 110 and the second contacts 116. The common contact formation process is photolithographically focused on the region of the semiconductor substrate with the one or more transistor cells, not on the pn diode 101. According to these embodiments, the plurality of first contacts 110 is spaced (d_min) a minimum distance e.g. of at least 50 μm from a first edge 130 of the pn diode 101 along which the rows 122 of first contacts 110 run parallel. Likewise, the plurality of second contacts 116 is spaced the same or different minimum distance from a second edge 132 of the pn diode 101 along which the rows 124 of second contacts 116 run parallel. With such minimum spacing, the contacts 110, 116 to the p-type and n-type regions 112, 118 of the pn diode 101 are reliably formed even though the pn diode 101 is formed at a different level than the focal point of the photolithography process used to form the contacts to the region of the semiconductor substrate with the one or more transistor cells. This way, the contacts 110, 116 to the pn diode 101 and the contacts to the transistor cell(s) can be formed at the same time using a common contact formation process.

Figure 1B:
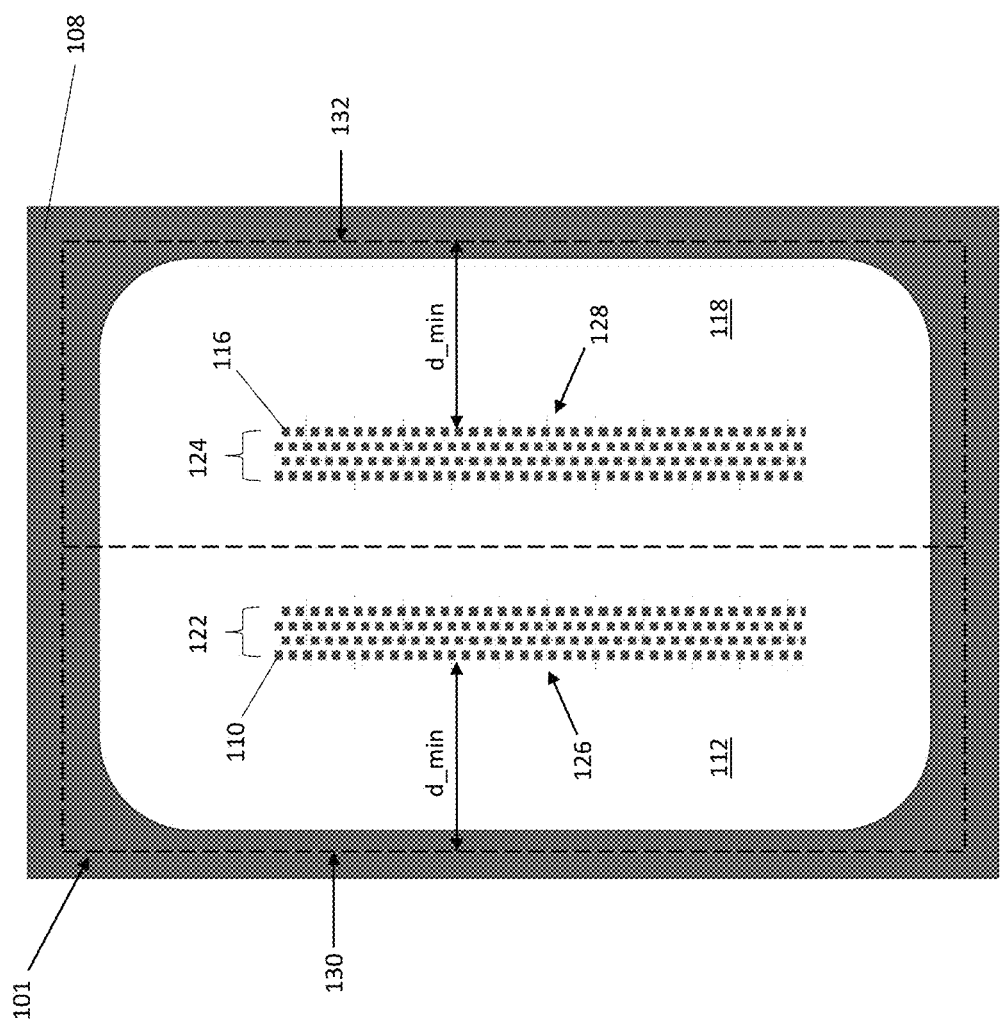
FIG. 1B illustrates a partial top plan view of the integrated pn diode temperature sensor.

FIGS. 2A through 2E illustrate partial sectional views of an embodiment of a method of manufacturing a semiconductor device that includes the integrated pn diode temperature sensor shown in FIGS. 1A and 1B.

FIG. 2A shows a semiconductor substrate 200 with a cell region in which one or more transistor cells are to be formed, a diode adjacent the cell region. The substrate 200 can comprise any type of semiconductor material such as a single element semiconductor (e.g. Si, Ge, etc.), silicon-on-insulator, a binary semiconductor (e.g. SiC, GaN, GaAs, etc.), a ternary semiconductor, etc. with or without epitaxial layer(s). An oxide and nitride 204 are deposited on the top surface of the semiconductor substrate 200. The semiconductor substrate 200 is etched through openings 206 formed in the oxide/nitride material 204.

A field oxide region 202 such as LOCOS provides isolation between the cell region and the diode region of the substrate 200. Trenches 204 are formed in the cell region of the semiconductor substrate 200. The trenches 204 in the cell region can include gate trenches 206 and field plate trenches 208, and define sub-micron semiconductor mesas 210. The trenches 204 are filled with an electrode material 212 such as doped polysilicon. The electrode material 212 in each trench 204 is separated from the surrounding semiconductor material by a dielectric material 214 such as a standard gate oxide. The dielectric material 214 can be thicker and/or comprise a different material in the field plate trenches 208 than in the gate trenches 206.

FIG. 2B shows the semiconductor substrate 200 after the lower and upper layers 104, 106 of the first interlayer dielectric material 102 shown in FIGS. 1A and 1B are formed over the semiconductor substrate 200, and after the integrated pn diode 101 shown in FIGS. 1A and 1B is formed between the lower and upper layers 104, 106 of the first interlayer dielectric material 102 over the diode region of the semiconductor substrate 200 which is devoid of transistor cells. Various embodiments of forming the pn diode 101 are described in more detail later herein.

Figure 2C:
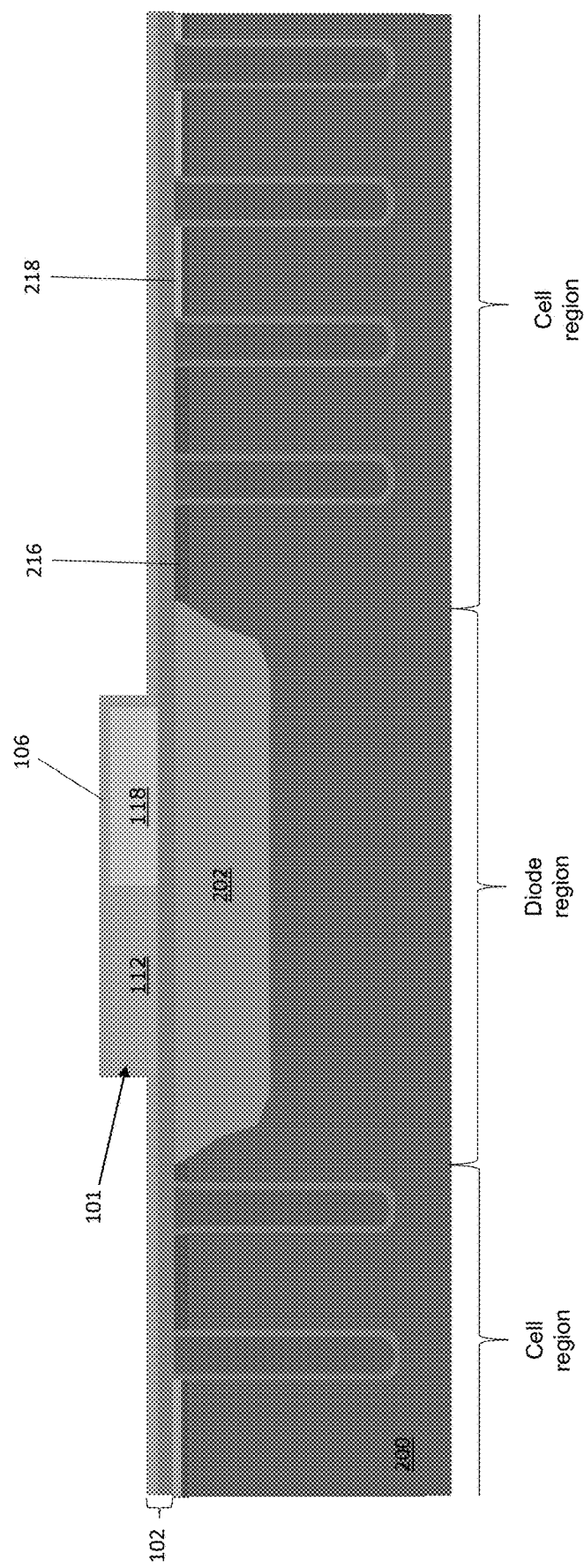

FIG. 2C shows the semiconductor substrate 200 after body and source/emitter regions 216, 218 are formed in the cell region of the substrate 200. Any standard implantation process can be used to form the body and source/emitter regions 216, 218 which are oppositely doped (p-body, n-source/emitter; or n-body, p-source/emitter).

Figure 2D:
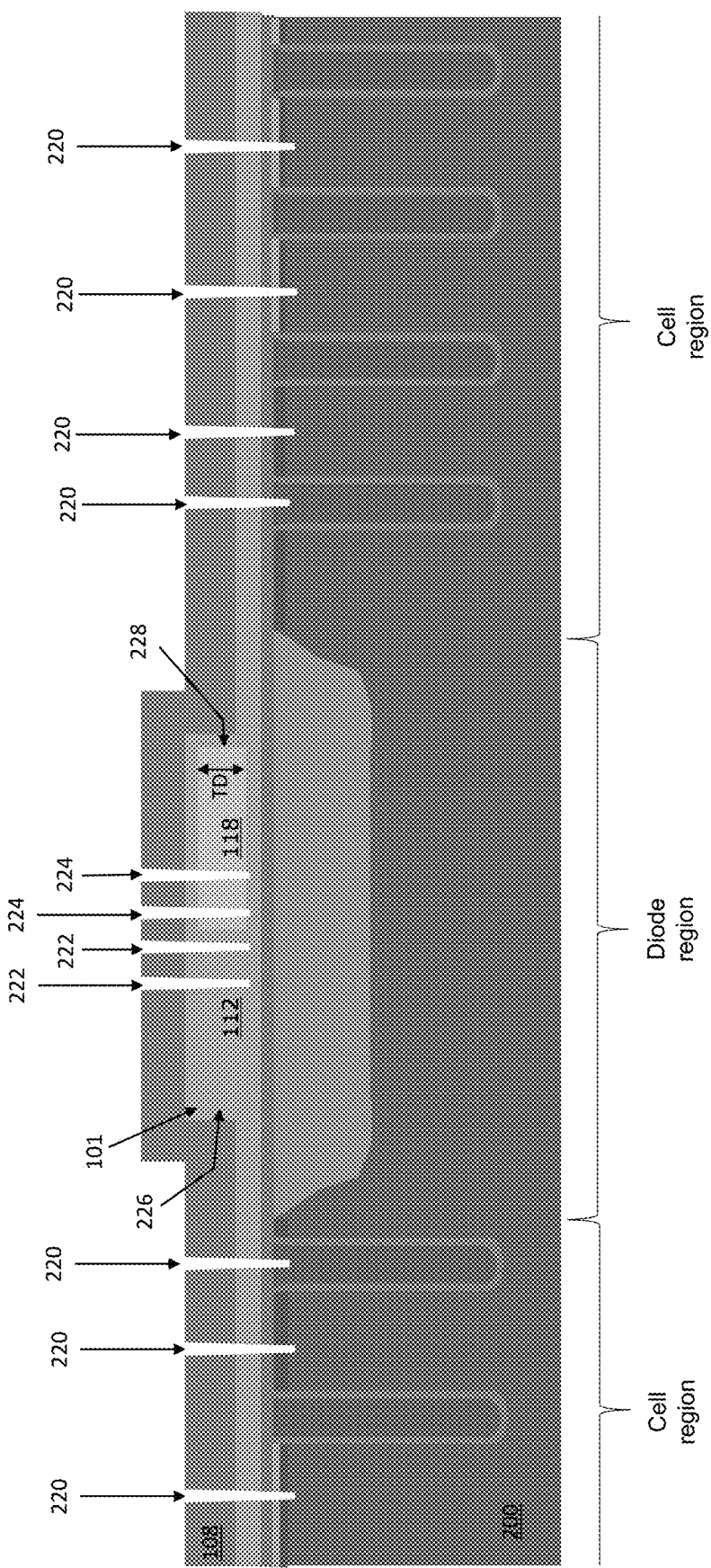

FIG. 2D shows the semiconductor substrate 200 after the second interlayer dielectric material 108 shown in FIGS. 1A and 1B is formed over the upper layer 106 of the first interlayer dielectric material 102, and after a common contact groove formation process. During the common contact groove formation process, a plurality of contact grooves 220 which extend into the cell region of the semiconductor substrate 200 are formed at the same time as a plurality of first contact grooves 222 which extend into the p-type region 112 of the integrated pn diode 101 and a plurality of second contact grooves 224 which extend into the n-type region 118 of the integrated pn diode 101. The common contact formation process is photolithographically focused on the cell region of the semiconductor substrate 200, not on the pn diode 101.

To ensure proper contact formation to the pn diode 101, the plurality of first contact grooves 222 is spaced a minimum distance such as at least 50 μm from a first edge 226 of the pn diode 101 along which the first contact grooves 222 run parallel. Likewise, the plurality of second contact grooves 224 is spaced the same or different minimum distance from a second edge 228 of the pn diode 101 along which the second contact grooves 224 run parallel. With such minimum spacing, the contact grooves 222, 224 extending into the pn diode 101 are reliably formed even though the pn diode 101 is formed at a different level than the focal point of the photolithography process used to form the contact grooves 220 to the cell region of the semiconductor substrate 200. This way, the contact grooves 222, 224 to the pn diode 101 and the contact grooves 220 to the cell region of the substrate 200 can be formed at the same time using a common contact groove formation process.

Some of the contact grooves 220 in the cell region extend into the electrodes 212 disposed in the field plate trenches 208, whereas other ones of the contact grooves 220 in the cell region extend into the body region 216 through the adjacent source/emitter regions 218 to form respective gate and source/body contact grooves in the cell region. Contact grooves to the electrodes 212 disposed in the gate trenches 206 in the cell region are out of view in FIG. 2D.

According to the embodiment illustrated in FIG. 2D, the thickness (TD) of the diode 101 is less than the contact groove etch depth. As such, the common contact groove etch extends through the entire pn diode 101 and stops at or enters the lower layer 104 of the first dielectric material 102 disposed between the pn diode 101 and the semiconductor substrate 200. As a result, the plurality of first diode contact grooves 222 extends through the p-type region 112 of the pn diode 101 and into the lower layer 104 of the first dielectric material 102. Similarly, the plurality of second diode contact grooves 224 extends through the n-type region 118 of the pn diode 101 and into the lower layer 104 of the first dielectric material 102.

Figure 2E:
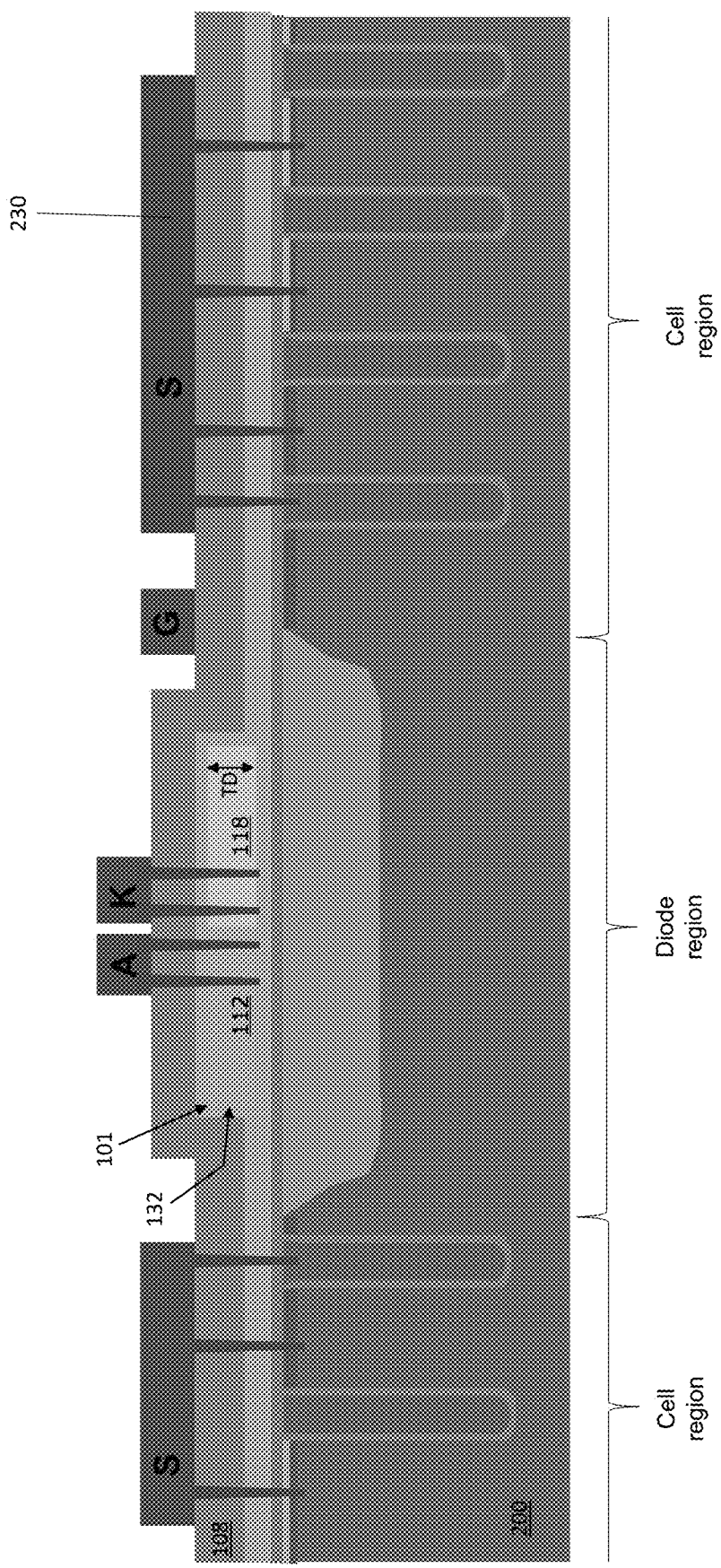

FIG. 2E shows the semiconductor substrate 200 after a p-type implant is performed to provide ohmic contact to the body region 216, followed by deposition of an electrically conductive material 230 such as a metal over the semiconductor substrate 200 to fill the various contact grooves 2220, 222, 224 and patterned to form corresponding electrodes of the semiconductor device. For example, the electrodes can include drain/collector (D), source/emitter (S) and gate (G) electrodes for one or more power transistors such as an IGBT or power MOSFET formed in the cell region of the semiconductor substrate 200, and anode (A) and cathode (K) electrodes for the integrated pn diode 101 formed over the diode region of the substrate 200.

The p-type implant described above and performed prior to deposition of the electrically conductive material 230 that fills the various contact grooves 220, 222, 224 increases the doping concentration of the body region 216 in the region where the contact grooves 220 enter the body region 216. The resulting highly doped region, also referred to as a body contact region, provides good ohmic contact between the body region 216 and the electrically conductive material 230 which fills the contact grooves 220 that extend into the body region 216. In one embodiment, after implanting the p-type body contact dopants and prior to filling the contact grooves 220, 222, 224 with the electrically conductive material 230, the second dielectric material 108 and the upper layer 106 of the first dielectric material 102 are etched back around the perimeter of each diode contact groove 222, 224 so that the pn diode 101 is not covered by the upper layer 108 of the first dielectric material 102 or the second dielectric material 108 in each region wherein the upper layer 106 of the first dielectric material 102 and the second dielectric material 108 are etched back.

The diode contact groove arrangement shown in FIG. 2D, where the diode contact grooves 222, 224 extend through the pn diode 101 and into the lower layer 106 of the first dielectric material 102, may be beneficial in limiting an amount of p-type dopants that enter the n-type region 118 of the pn diode 101 during the body contact implantation process. The p-type dopant species should pass mostly through the contact grooves 224 in the n-type region 118 of the pn diode 101 and enter the lower layer 106 of the first dielectric material 102 without penetrating into the n-type diode region 118. For thicker pn diodes where the diode contact grooves 222, 224 do not extend entirely through the diode 101 and into the lower layer 106 of the first dielectric material 102, the contact grooves 224 penetrating the n-type region 118 of the diode 101 can be masked prior to the p-type body contact implantation process to prevent the p-type dopants from entering the n-type region 118 of the diode 101.

FIGS. 3A through 3H illustrate partial sectional views of another embodiment of a method of manufacturing the integrated pn diode temperature sensor shown in FIGS. 1A and 1B. The underlying semiconductor substrate is not shown in FIGS. 3A through 3H for ease of illustration.

Figure 3A:
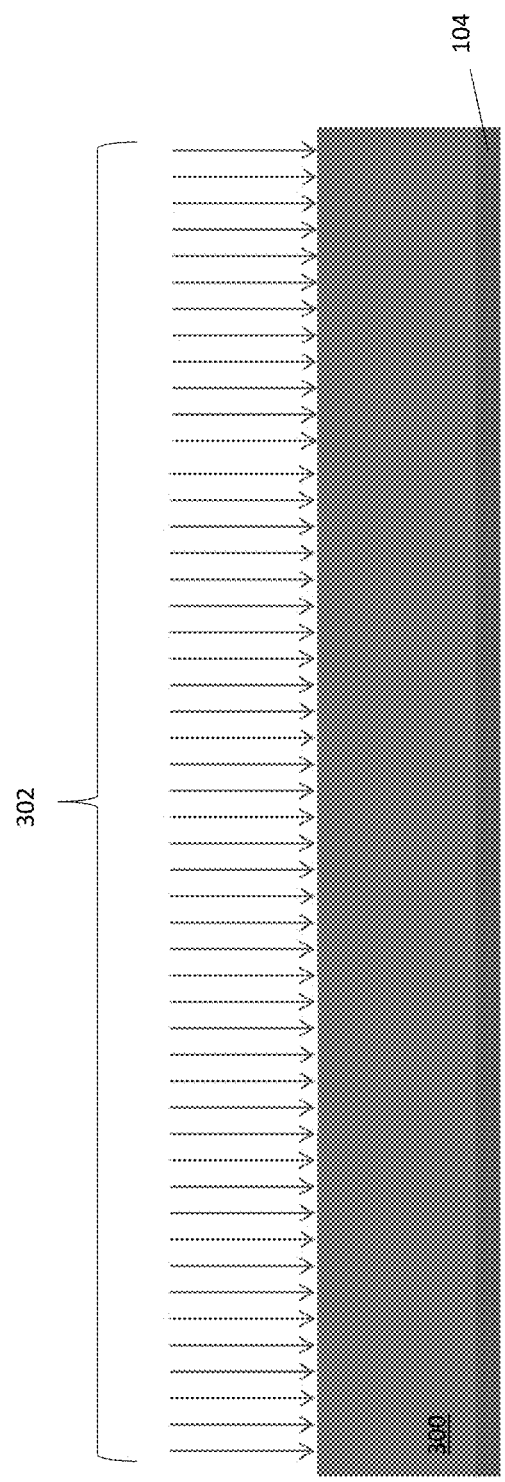

FIG. 3A shows a blanket layer of polycrystalline or amorphous silicon 300 formed on the lower layer 104 of the first dielectric material 102 and being implanted with a p-type dopant species 302.

Figure 3B:
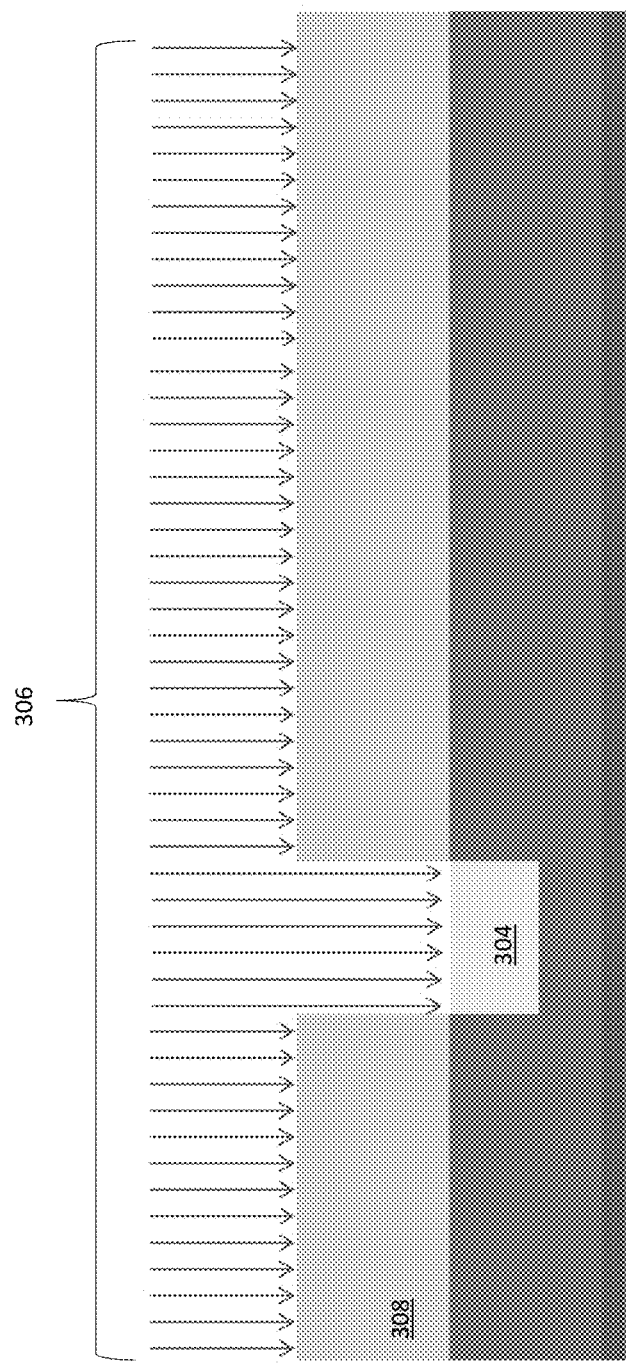

FIG. 3B shows a cathode implant region 304 of the pn diode being formed by an n-type dopant species 306 implanted through an opening in a mask 308.

Figure 3C:
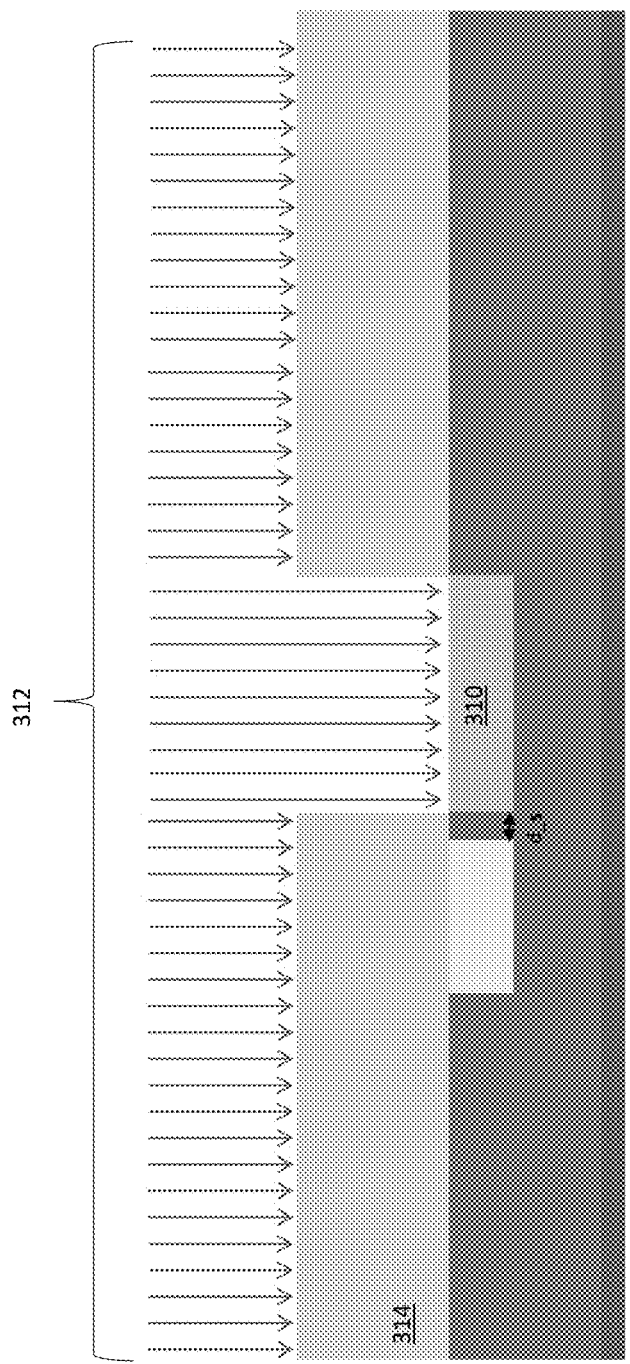

FIG. 3C shows an anode implant region 310 of the pn diode being formed by a p-type dopant species 312 implanted through an opening in a mask 314. The cathode and anode implant regions 304, 310 are shown spaced apart by a distance d_s in FIG. 3C, e.g. of about 1 µm. However, the p-type anode implantation 312 can overlap into the cathode implant region 304 so that no gap is present between the anode and cathode implant regions 304, 310.

Figure 3D:
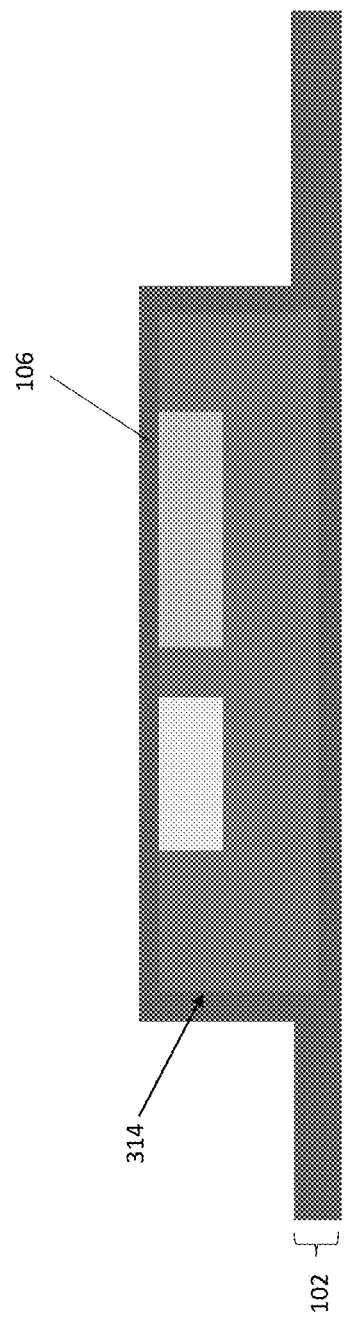

FIG. 3D shows the structure after the layer 300 of polycrystalline or amorphous silicon is patterned into a pn diode 314 which is disposed over just the region of the semiconductor substrate devoid of transistor cells, and after the upper layer 106 of the first dielectric material 102 is formed on the pn diode 314 and on the lower layer 104 of the first dielectric material 102 outside the diode region.

FIG. 3E shows the structure after the second dielectric material 108 is formed over the first dielectric material 102, and after diffusion and activation of the cathode and anode implants to form respective anode and cathode regions 316, 318 of the pn diode 314.

Figure 3F:
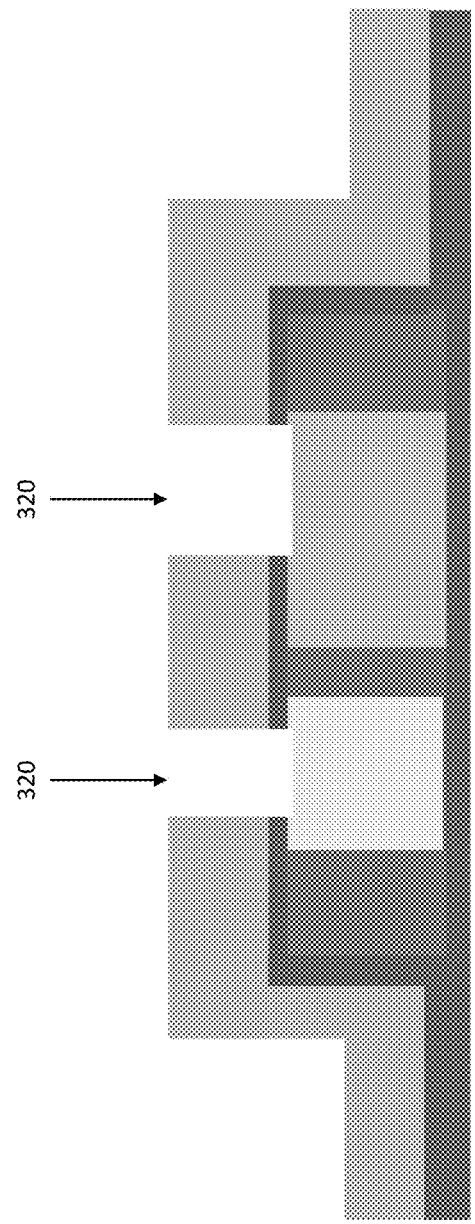

FIG. 3F shows the structure after openings 320 are formed in the second dielectric material 108 and in the upper layer 106 of the first dielectric material 102.

Figure 3G:
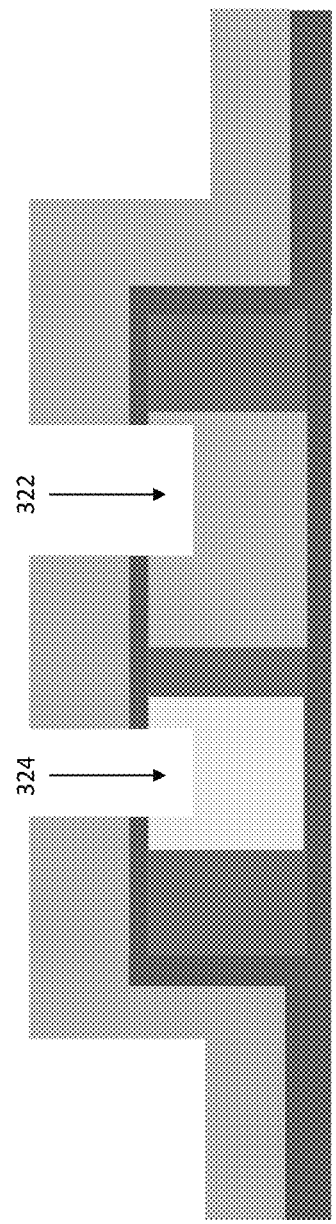

FIG. 3G shows the structure after contact grooves 322, 324 are etched through the openings 320 in the second dielectric material 108 and the upper layer 106 of the first dielectric material 102, and which extend into the p-type and n-type regions 316, 318 of the pn diode 314. According to this embodiment, the thickness of the polycrystalline or amorphous silicon 300 is greater than the contact groove etch depth. As such, the common contact groove etch does not enter the lower layer 104 of the first dielectric material 102 disposed between the pn diode 314 and the underlying semiconductor substrate. As a result, each anode contact groove 322 terminates within the p-type region 316 of the pn diode 314 before reaching the lower layer 104 of the first dielectric material 102. Likewise, each cathode contact groove 324 terminates within the n-type region 318 of the pn diode 314 before reaching the lower layer 104 of the first dielectric material 102.

Figure 3H:
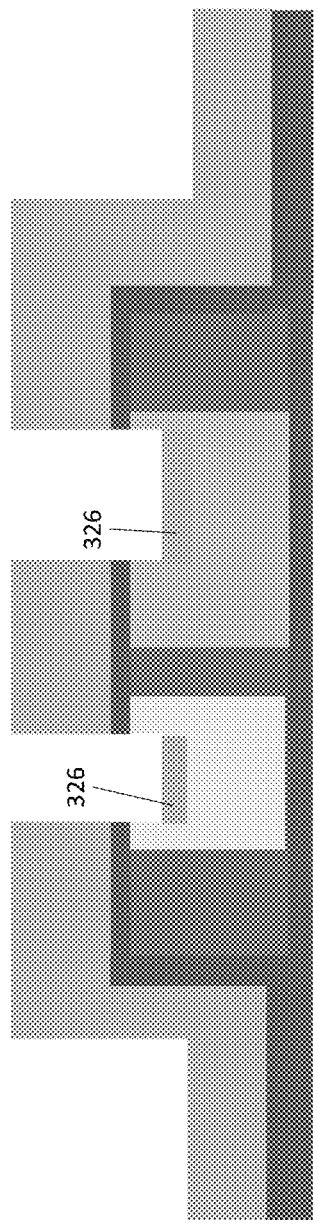

FIG. 3H shows the structure after the common body contact implantation process described above in connection with FIGS. 2D and 2E is performed across the substrate, to form P+ body contact regions in the body region (out of view in FIG. 3H) of the transistor region of the semiconductor substrate. Because the diode contact grooves 322, 324 do not extend all the way through the polycrystalline or amorphous silicon 300, both the anode region 316 and the cathode region 318 of the pn diode 314 include a P+ contact region 326 according to this embodiment. The contact grooves 322, 324 are then filled with an electrically conductive material such as a metal, e.g. as previously described herein in connection with FIG. 2E.

Figure 4:
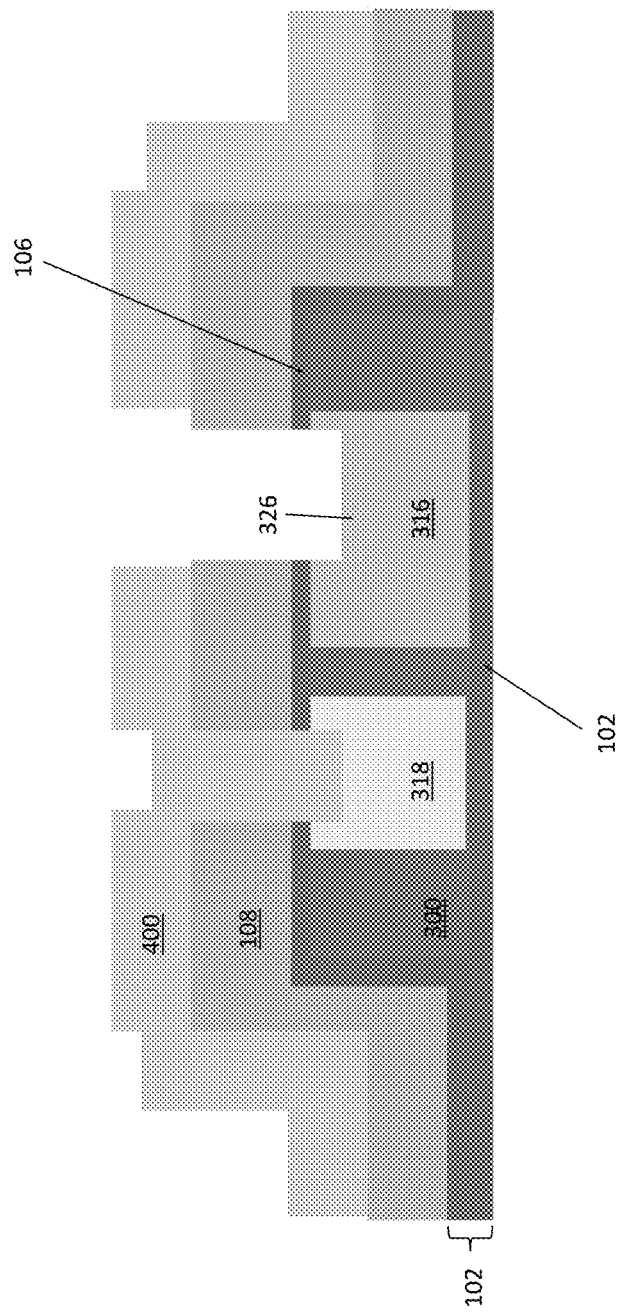
FIG. 4 illustrates a partial sectional view of an alternative embodiment in which a mask is formed on the pn diode structure after forming the diode contact grooves and before a common body contact implantation process.

FIG. 4 illustrates a partial sectional view of an alternative embodiment in which a mask 400 is formed on the pn diode structure after forming the diode contact grooves 322, 324 and before the common body contact implantation process. According to this embodiment, the mask 400 blocks the p-type body contact implant from entering the cathode region 318 of the pn diode. The mask 400 is removed after the common body contact implantation process.

Figure 5:
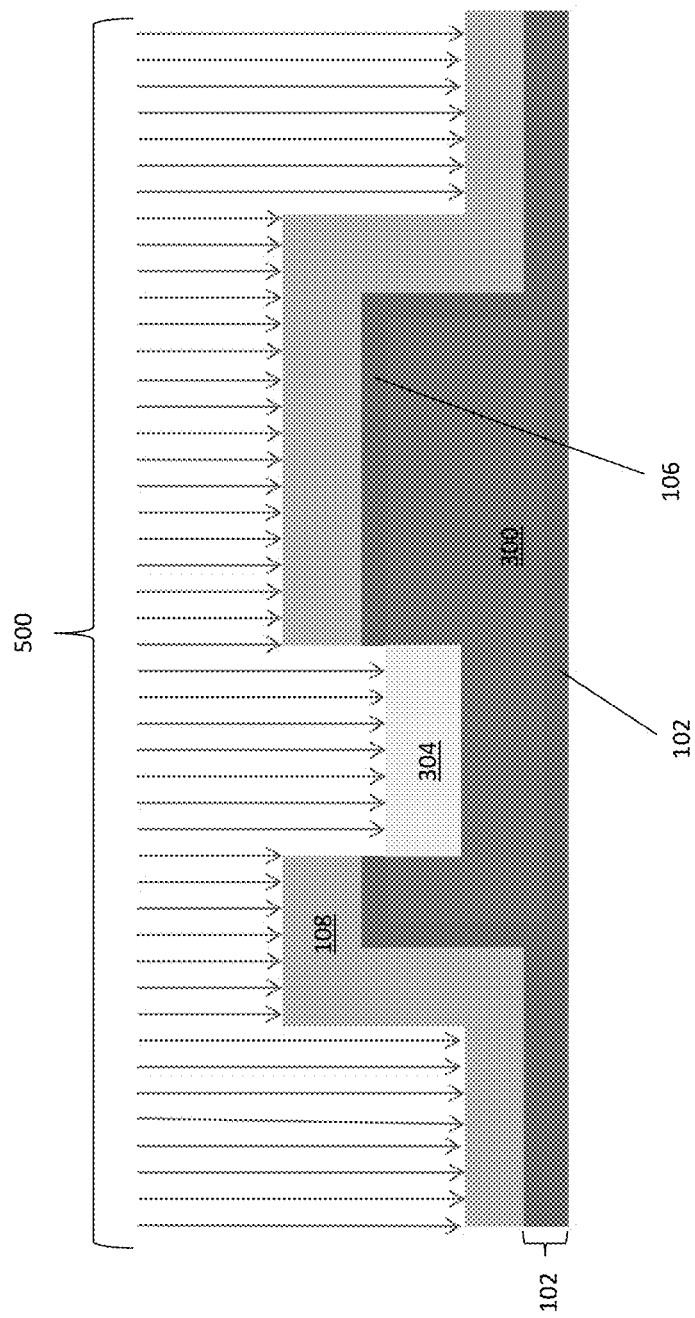
FIG. 5 illustrates a partial sectional view of an alternative embodiment in which the cathode region of the pn diode is formed after a second dielectric material is formed over the diode structure.

FIG. 5 illustrates a partial sectional view of an alternative embodiment in which the cathode implant region 304 of the pn diode is formed after the second dielectric material 108 is formed over the diode structure. According to this embodiment, an opening is formed in the second dielectric material 108 and in the upper layer 106 of the first dielectric material 102 to expose the cathode implant region 304 of the diode. An n-type dopant species 500 is then implanted through the opening in the second dielectric material 108 and the upper layer 106 of the first dielectric material 102 and into the polycrystalline or amorphous silicon 300. The n-type dopants 500 are subsequently diffused and activated to form the cathode region of the pn diode.

In addition or alternatively to the embodiments described above, the layer 300 of polycrystalline or amorphous silicon can be blanket implanted with an n-type dopant species in FIG. 3A instead of a p-type dopant species. The diode structure can be subsequently masked and implanted with a p-type dopant species to define the anode region of the diode.

In addition or alternatively to the embodiments described above, the separate implant shown in FIG. 3C to define the anode region of the pn diode can be skipped. Instead, the anode region of the diode can be defined by the common p-type body contact implantation process described herein whereby the p-type dopant species enters the polycrystalline or amorphous silicon 300 through the previously formed anode contact grooves 322. The anode region is formed by subsequent diffusion/activation of the p-type dopant species implanted through the anode contact grooves 322 during the common p-type body contact implantation process.

In addition or alternatively to the embodiments described above, a mask can be applied to the anode contact grooves 322 so that the common p-type body contact implant is partly or even completely blocked in the anode region 316 of the pn diode.

In addition or alternatively to the embodiments described above, the implant activation for the cathode and anode implant regions 304, 310 of the pn diode temperature sensor can be achieved using the base technology source diffusion drive which occurs after the pn diode temperature sensor fabrication steps.

Figure 6:
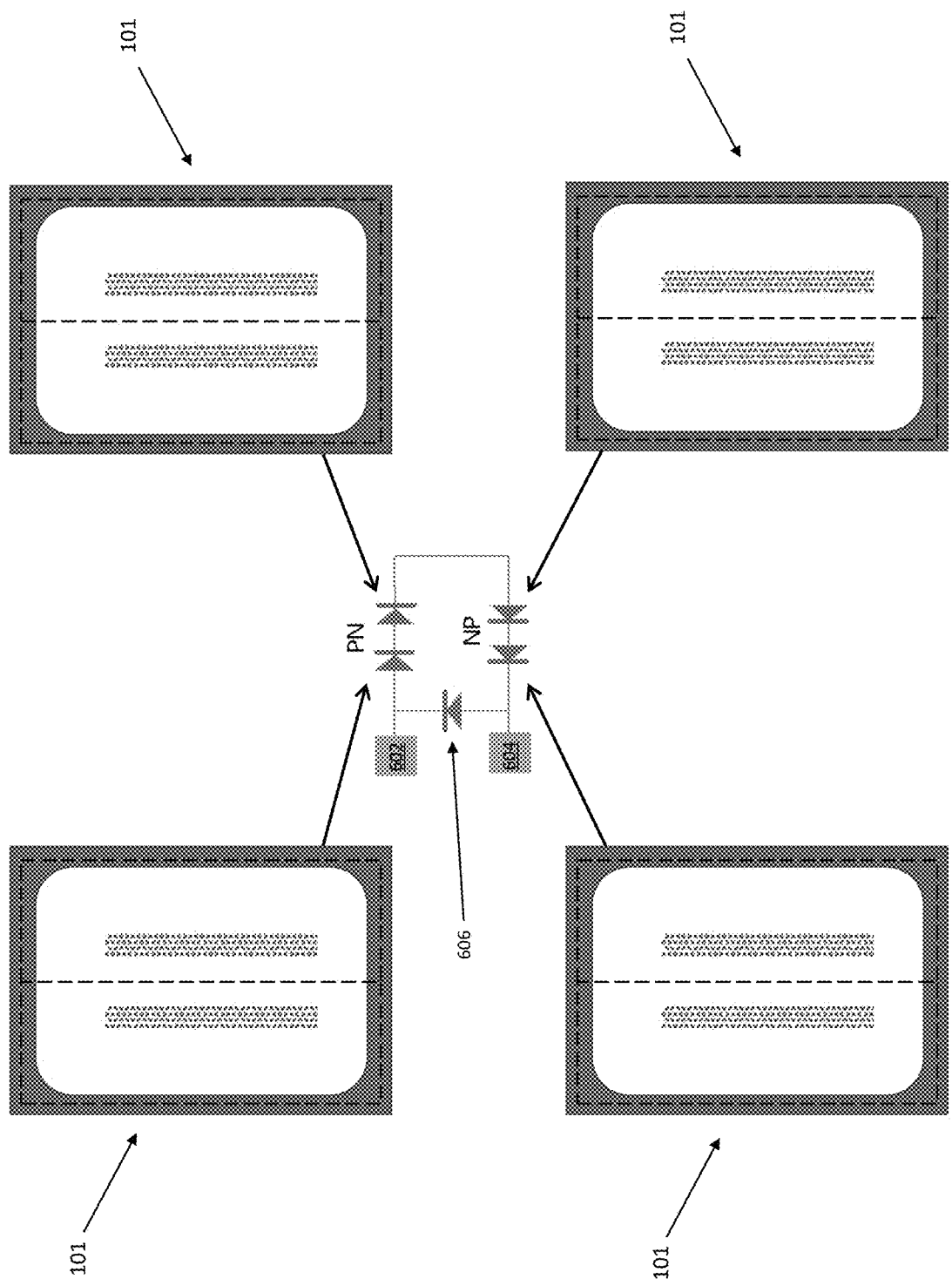
FIG. 6 illustrates a hybrid circuit schematic of an embodiment of a temperature sensor circuit implemented with four of the integrated pn diodes.

FIG. 6 illustrates a hybrid circuit schematic of a temperature sensor circuit 600 implemented with four of the integrated pn diodes 101 described herein. Two of the pn diodes 101 are electrically connected in series in a 'PN' configuration, and the other two pn diodes 101 are electrically connected in series in an 'NP' configuration. The two chains of series-connected diodes are connected at one end to a first terminal 602 of the semiconductor device, and at the other end to a second terminal 604 of the device. An optional antiparallel ESD (electrostatic discharge) prevention diode 606 is connected between the terminals 602, 604 of the temperature sensor circuit 600.

Figure 7C:
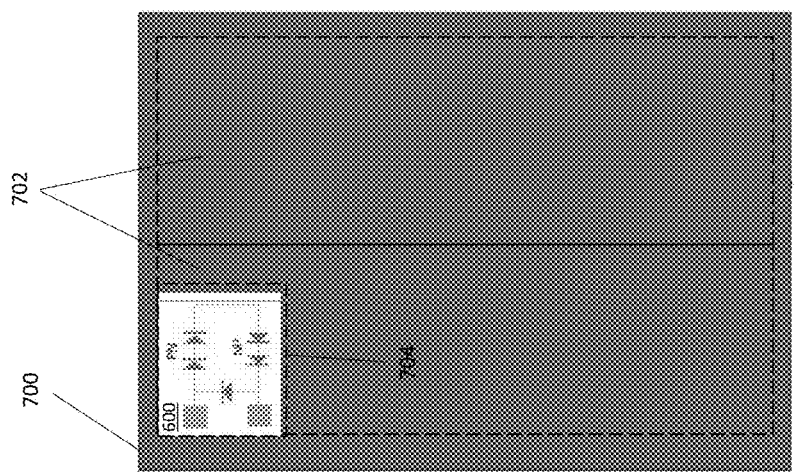
FIGS. 7A through 7C illustrate respective top plan views of different placement embodiments for the integrated pn diode temperature sensor in a semiconductor die.
Figure 7B:
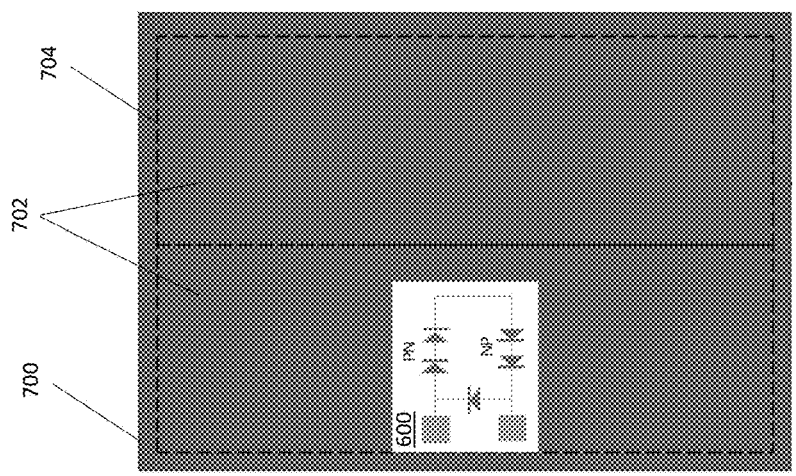
Figure 7A:
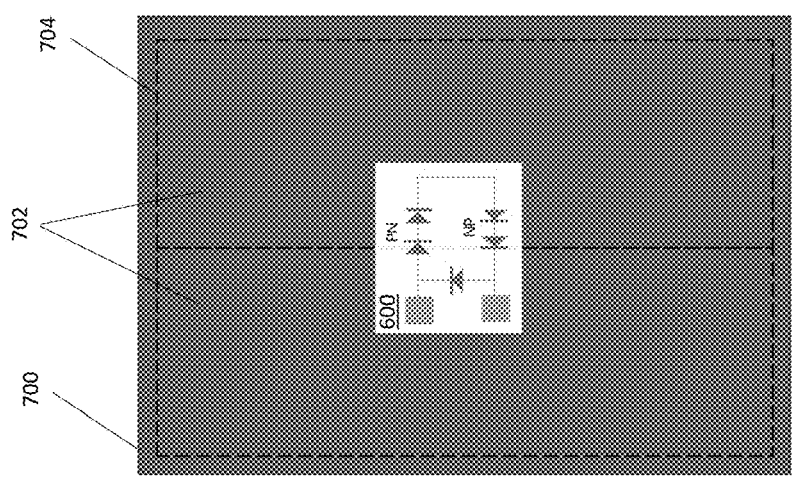

The temperature sensor circuit 600 can be located over the center of the cell region 702 of the semiconductor die (chip) 700 as shown in FIG. 7A, over the periphery/edge of the cell region 702 of the die 700 as shown in FIG. 7B, or outside the edge termination region 704 of the die 700 as shown in FIG. 7C. The edge termination region 704 is the region of the die 700 devoid of fully-functional transistor cells, and provides a transition region between the cell region and the physical edge of the die 700. Still other diode placement options are contemplated.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a semiconductor device, the method comprising:
   forming one or more transistor cells in a first region of a semiconductor substrate, the semiconductor substrate having a second region that is devoid of transistor cells;
   forming a first dielectric material over the first region and the second region of the semiconductor substrate;
   forming a second dielectric material over the first dielectric material;
   forming a pn diode between two layers of the first dielectric material over the second region of the semiconductor substrate;
   etching first contact grooves into a p-type region of the pn diode, second contact grooves into an n-type region of the pn diode, and third contact grooves into the first region of the semiconductor substrate, the first contact grooves, the second contact grooves and the third contact grooves being etched at the same time using a common contact formation process;
   photolithographically focusing the common contact formation process on the first region of the semiconductor substrate and not on the pn diode;
   spacing the first contact grooves at least 50 pm from a first edge of the pn diode along which the first contact grooves runs parallel;

spacing the second contact grooves at least 50 pm from a second edge of the pn diode along which the second contact grooves runs parallel; and filling the first contact grooves, the second contact grooves and the third contact grooves with an electrically conductive material.

2. The method of claim 1, wherein etching the first contact grooves comprises etching the first contact grooves through the p-type region of the pn diode and into a lower layer of the first dielectric material disposed between the pn diode and the semiconductor substrate, and wherein etching the second contact grooves comprises etching the second contact grooves through the n-type region of the pn diode and into the lower layer of the first dielectric material.

3. The method of claim 1, wherein etching the first contact grooves comprises etching the first contact grooves so that the first contact grooves terminate within the p-type region of the pn diode before reaching a lower layer of the first dielectric material disposed between the pn diode and the semiconductor substrate, and wherein etching the second contact grooves comprises etching the second contact grooves so that the second contact grooves terminate within the n-type region of the pn diode before reaching the lower layer of the first dielectric material.

4. The method of claim 1, wherein the first contact grooves extend through the second dielectric material, through an upper layer of the first dielectric material covering the pn diode and into the p-type region of the pn diode, wherein the second contact grooves extend through the second dielectric material, through the upper layer of the first dielectric material and into the n-type region of the pn diode, and wherein the third contact grooves extend through the second dielectric material, through the first dielectric material and into the first region of the semiconductor substrate.

5. The method of claim 1, further comprising:
prior to filling the first contact grooves, the second contact grooves and the third contact grooves with the electrically conductive material, implanting p-type dopants into the first contact grooves, the second contact grooves and the third contact grooves.

6. The method of claim 5, further comprising:
after implanting the p-type dopants and prior to filling the first contact grooves, the second contact grooves and the third contact grooves with the electrically conductive material, etching back the first dielectric material and the second dielectric material around the perimeter of each first contact groove and each second contact groove so that the pn diode is not covered by the first dielectric material or the second dielectric material in each region wherein the first dielectric material and the second dielectric material are etched back.

7. The method of claim 1, wherein forming the first dielectric material and forming the pn diode comprises:
forming a first layer of the first dielectric material over the first region and the second region of the semiconductor substrate;
forming polycrystalline silicon on the first layer of the first dielectric material over the second region but not the first region of the semiconductor substrate;
forming a second layer of the first dielectric material on the first layer over the first region of the semiconductor substrate and on the polycrystalline silicon over the second region of the semiconductor substrate; and
forming the pn diode in the polycrystalline silicon between the first layer and the second layer.

8. The method of claim 1, wherein forming the first dielectric material and forming the pn diode comprises:
forming a first layer of the first dielectric material over the first region and the second region of the semiconductor substrate;
forming amorphous silicon on the first layer of the first dielectric material over the second region but not the first region of the semiconductor substrate;
forming a second layer of the first dielectric material on the first layer over the first region of the semiconductor substrate and on the amorphous silicon over the second region of the semiconductor substrate; and
forming the pn diode in the amorphous silicon between the first layer and the second layer.

9. The method of claim 1, wherein the first contact grooves are arranged in rows that extend generally parallel with one another, and wherein the second contact grooves are arranged in rows that extend generally parallel with one another.

10. The method of claim 1, wherein the first contact grooves are arranged in a first checkerboard pattern, and wherein the second contact grooves are arranged in a second checkerboard pattern.

11. The method of claim 1, further comprising:
forming a third dielectric material over the second region of the semiconductor substrate but not the first region, wherein the first dielectric material is separated from the semiconductor substrate by the third dielectric material.

12. The method of claim 1, wherein the pn diode comprises polycrystalline or amorphous silicon having a thickness between 300 nm and 950 nm.

13. The method of claim 1, wherein the first dielectric material comprises undoped silicate glass (USG), wherein the second dielectric material comprises borophosphosilicate glass (BPSG), and wherein the pn diode comprises polycrystalline or amorphous silicon.

14. The method of claim 1, wherein a first group of the third contact grooves extend into electrodes disposed in field plate trenches formed in the first region of the semiconductor substrate, and wherein a second group of the third contact grooves extend into a body region of the one or more transistor cells in the first region of the semiconductor substrate.

15. The method of claim 1, further comprising:
patterning the electrically conductive material to form electrodes for the one or more transistor cells formed in the first region of a semiconductor substrate, and anode and cathode electrodes for the pn diode formed over the second region of the semiconductor substrate.

16. The method of claim 1, wherein the p-type region of the pn diode abuts sidewalls of each first contact, wherein the n-type region of the pn diode abuts sidewalls of each second contact, and wherein each third contact extends into an electrode or a doped region of the one or more transistor cells in the first region of the semiconductor substrate.

17. A method of manufacturing a semiconductor device, the method comprising:
forming one or more transistor cells in a semiconductor substrate;
forming a pn diode between two layers of a dielectric material above the semiconductor substrate;
etching first contact grooves into a p-type region of the pn diode, second contact grooves into an n-type region of the pn diode, and third contact grooves into a first region of the semiconductor substrate, the first contact grooves, the second contact grooves and the third contact grooves being etched at the same time using a common contact formation process;
photolithographically focusing the common contact formation process on the first region of the semiconductor substrate and not on the pn diode;
spacing the first contact grooves at least 50 pm from a first edge of the pn diode along which the first contact grooves runs parallel;
spacing the second contact grooves at least 50 pm from a second edge of the pn diode along which the second contact grooves runs parallel; and
filling the first contact grooves, the second contact grooves and the third contact grooves with an electrically conductive material.

\* \* \* \* \*